(12) United States Patent  
Peterson et al.

(10) Patent No.: US 8,927,890 B2  
(45) Date of Patent: *Jan. 6, 2015

(54) CAPACITIVE KEYSWITCH TECHNOLOGIES

(71) Applicant: Synaptics Incorporated, San Jose, CA (US)

(72) Inventors: Cody George Peterson, Hayden, ID (US); Douglas M. Krumpelman, Hayden, ID (US); Andrew P. Huska, Liberty Lake, WA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/257,500

(22) Filed: Apr. 21, 2014

(65) Prior Publication Data

US 2014/0224633 A1  Aug. 14, 2014

Related U.S. Application Data

(63) Continuation of application No. 13/413,639, filed on Mar. 6, 2012, now Pat. No. 8,735,755.

(60) Provisional application No. 61/546,652, filed on Oct. 13, 2011, provisional application No. 61/450,054, filed on Mar. 7, 2011.

(51) Int. Cl.
*H03K 17/975* (2006.01)
*H03K 17/96* (2006.01)
*H03K 17/98* (2006.01)

(52) U.S. Cl.
CPC .......... *H03K 17/9622* (2013.01); *H03K 17/962* (2013.01); *H03K 17/98* (2013.01); *H03K 2217/96077* (2013.01)
USPC .......................................................... 200/600

(58) Field of Classification Search
CPC ................ H03K 17/962; H03K 17/98; H03K 2217/96077; H03K 17/975; H03K 2217/960755; H03K 2017/9602; H01H 2239/006
USPC .................... 200/600, 5 R, 46, 506, 512, 514
See application file for complete search history.

(56) References Cited

U.S. PATENT DOCUMENTS 3,886,341 A  5/1975  Forrest
3,921,167 A  11/1975  Fox (Continued)

FOREIGN PATENT DOCUMENTS

CN  102035525 A  4/2011
CN  102832921 A  12/2012

(Continued)

OTHER PUBLICATIONS

Fukumoto, Masaki, et al, "Active Click: Tactile Feedback for Touch Panels", NTT DoCoMo Multimedia Labs, Mar. 31, 2001, 2 pages.

(Continued)

*Primary Examiner* — Edwin A. Leon
(74) *Attorney, Agent, or Firm* — Ingrassia Fisher & Lorenz, P.C.

(57) ABSTRACT

Described herein are techniques related to capacitance-based keyswitch technologies. According to one implementation, an apparatus includes a key with a floating electrode. The floating electrode pairs with a fixed electrode and a capacitance may be generated between them. The apparatus has a controller configured to measure the capacitance as the electrodes move relative to each other as the key is depressed and released. This Abstract is submitted with the understanding that it will not be used to interpret or limit the scope or meaning of the claims.

22 Claims, 11 Drawing Sheets

(56) References Cited

U.S. PATENT DOCUMENTS

| | | |
|---|---|---|
| 4,334,280 A | 6/1982 | Mcdonald |
| 4,403,123 A | 9/1983 | Shek |
| 4,417,294 A | 11/1983 | Herron, Jr. |
| 4,439,647 A | 3/1984 | Calandrello et al. |
| D278,239 S | 4/1985 | Felix et al. |
| 4,543,564 A | 9/1985 | Audoin et al. |
| D284,574 S | 7/1986 | Fischer |
| 4,614,937 A | 9/1986 | Poujois |
| D292,801 S | 11/1987 | Davis, Jr. et al. |
| 4,786,766 A | 11/1988 | Kobayashi |
| 4,885,565 A | 12/1989 | Embach |
| D312,623 S | 12/1990 | Carter et al. |
| 5,121,091 A | 6/1992 | Fujiyama |
| 5,189,390 A | 2/1993 | Fagard |
| 5,212,473 A | 5/1993 | Louis |
| 5,626,223 A | 5/1997 | Lee |
| 5,667,061 A | 9/1997 | Lee |
| 5,767,463 A | 6/1998 | Gandre |
| 5,921,382 A | 7/1999 | Retter |
| 5,973,670 A | 10/1999 | Barber et al. |
| 5,977,867 A | 11/1999 | Blouin |
| 5,977,888 A | 11/1999 | Fujita et al. |
| 5,982,304 A | 11/1999 | Selker et al. |
| 6,039,258 A | 3/2000 | Durbin et al. |
| 6,067,081 A | 5/2000 | Hahlganss et al. |
| 6,118,435 A | 9/2000 | Fujita et al. |
| 6,204,839 B1 | 3/2001 | Mato, Jr. |
| 6,218,966 B1 | 4/2001 | Goodwin et al. |
| 6,219,034 B1 | 4/2001 | Elbing et al. |
| 6,262,717 B1 | 7/2001 | Donohue et al. |
| 6,373,463 B1 | 4/2002 | Beeks |
| 6,392,515 B1 | 5/2002 | Van Zeeland et al. |
| 6,429,846 B2 | 8/2002 | Rosenberg et al. |
| 6,466,118 B1 | 10/2002 | Van Zeeland et al. |
| 6,542,058 B2 | 4/2003 | Van Zeeland |
| 6,677,843 B1 | 1/2004 | Monroe et al. |
| 6,693,626 B1 | 2/2004 | Rosenberg |
| 6,723,937 B2 | 4/2004 | Englemann et al. |
| 6,819,990 B2 | 11/2004 | Ichinose |
| 6,822,635 B2 | 11/2004 | Shahoian et al. |
| 6,861,603 B1 | 3/2005 | Wang |
| 6,911,901 B2 | 6/2005 | Bown |
| 6,937,124 B1 | 8/2005 | Nakamura et al. |
| 6,982,617 B2 | 1/2006 | Brilon et al. |
| D527,004 S | 8/2006 | Yen |
| 7,106,305 B2 | 9/2006 | Rosenberg |
| 7,113,177 B2 | 9/2006 | Franzen |
| 7,119,798 B2 | 10/2006 | Yoshikawa et al. |
| 7,148,789 B2 | 12/2006 | Sadler et al. |
| 7,196,688 B2 | 3/2007 | Schena |
| 7,215,329 B2 | 5/2007 | Yoshikawa et al. |
| 7,227,537 B2 | 6/2007 | Nakayama et al. |
| 7,269,484 B2 | 9/2007 | Hein |
| 7,292,227 B2 | 11/2007 | Fukumoto et al. |
| 7,312,791 B2 | 12/2007 | Hoshino et al. |
| 7,324,094 B2 | 1/2008 | Moilanen et al. |
| 7,336,266 B2 | 2/2008 | Hayward et al. |
| 7,342,573 B2 | 3/2008 | Ryynaenen |
| 7,385,308 B2 | 6/2008 | Yerdon et al. |
| 7,400,319 B2 | 7/2008 | Nakayama et al. |
| 7,450,110 B2 | 11/2008 | Shahoian et al. |
| 7,525,415 B2 | 4/2009 | Yatsu et al. |
| 7,548,232 B2 | 6/2009 | Shahoian et al. |
| 7,567,232 B2 | 7/2009 | Rosenberg |
| 7,579,758 B2 | 8/2009 | Maruyama et al. |
| 7,589,607 B2 | 9/2009 | Rochon et al. |
| 7,592,999 B2 | 9/2009 | Rosenberg et al. |
| 7,602,384 B2 | 10/2009 | Rosenberg et al. |
| 7,607,087 B2 | 10/2009 | Prados |
| 7,855,715 B1 | 12/2010 | Bowen |
| 7,910,843 B2 | 3/2011 | Rothkopf et al. |
| 7,969,288 B2 | 6/2011 | Braun et al. |
| 7,982,720 B2 | 7/2011 | Rosenberg et al. |
| 8,031,181 B2 | 10/2011 | Rosenberg et al. |
| 8,059,105 B2 | 11/2011 | Rosenberg et al. |
| 8,274,478 B2 | 9/2012 | Bowen |
| 8,309,870 B2 | 11/2012 | Peterson et al. |
| 8,310,351 B2 | 11/2012 | Krahenbuhl et al. |
| 8,648,737 B1 | 2/2014 | Bowen |
| 8,674,941 B2 | 3/2014 | Casparian et al. |
| 2001/0002648 A1 | 6/2001 | Van Zeeland |
| 2002/0084721 A1 | 7/2002 | Walczak |
| 2003/0067449 A1 | 4/2003 | Yoshikawa et al. |
| 2004/0252104 A1 | 12/2004 | Nakamura et al. |
| 2005/0089356 A1 | 4/2005 | Jung-Tsung |
| 2006/0109256 A1 | 5/2006 | Grant et al. |
| 2006/0113880 A1 | 6/2006 | Pei et al. |
| 2006/0232559 A1 | 10/2006 | Chien et al. |
| 2007/0080951 A1 | 4/2007 | Maruyama et al. |
| 2007/0146334 A1 | 6/2007 | Inokawa |
| 2007/0165002 A1 | 7/2007 | Wassingbo |
| 2008/0042980 A1 | 2/2008 | Bowen |
| 2008/0062015 A1 | 3/2008 | Bowen |
| 2008/0100568 A1 | 5/2008 | Koch et al. |
| 2008/0142352 A1 | 6/2008 | Wright |
| 2008/0302647 A1 | 12/2008 | Villain et al. |
| 2009/0057124 A1 | 3/2009 | Orsley |
| 2009/0072662 A1 | 3/2009 | Sadler et al. |
| 2009/0255793 A1 | 10/2009 | Krochmal et al. |
| 2010/0231423 A1 | 9/2010 | Yang |
| 2010/0253629 A1 | 10/2010 | Orsley |
| 2010/0259481 A1 | 10/2010 | Oh |
| 2010/0309130 A1 | 12/2010 | Zhao et al. |
| 2010/0321301 A1 | 12/2010 | Casparian et al. |
| 2010/0328251 A1 | 12/2010 | Sinclair |
| 2011/0025607 A1 | 2/2011 | Bowen |
| 2011/0074609 A1 | 3/2011 | Lin |
| 2011/0095919 A1 | 4/2011 | Ostermoller et al. |
| 2011/0205161 A1 | 8/2011 | Myers et al. |
| 2011/0227762 A1 | 9/2011 | Bowen |
| 2011/0227763 A1 | 9/2011 | Schlosser et al. |
| 2011/0227872 A1 | 9/2011 | Huska et al. |
| 2012/0019445 A1 | 1/2012 | Liu |
| 2012/0020045 A1* | 1/2012 | Tanase .................. 361/807 |
| 2012/0043191 A1 | 2/2012 | Kessler et al. |
| 2012/0092263 A1 | 4/2012 | Peterson et al. |
| 2012/0119996 A1 | 5/2012 | Wu et al. |
| 2012/0169603 A1 | 7/2012 | Peterson et al. |
| 2012/0299832 A1 | 11/2012 | Peterson et al. |
| 2013/0075237 A1* | 3/2013 | Gutierrez .................. 200/181 |
| 2013/0082932 A1 | 4/2013 | Gluckstad et al. |
| 2013/0093681 A1 | 4/2013 | Hsu |
| 2013/0135207 A1 | 5/2013 | Neil et al. |
| 2013/0314325 A1 | 11/2013 | Furukawa |
| 2013/0342494 A1 | 12/2013 | Feng |
| 2014/0001021 A1 | 1/2014 | Zhang |
| 2014/0034468 A1 | 2/2014 | Krumpelman et al. |
| 2014/0055363 A1 | 2/2014 | Meierling et al. |

FOREIGN PATENT DOCUMENTS

| | | |
|---|---|---|
| CN | 202694270 U | 1/2013 |
| DE | 19744791 A1 | 4/1999 |
| EP | 0088030 A1 | 9/1983 |
| EP | 0278916 A | 8/1988 |
| JP | 2007173087 A1 | 7/2007 |
| JP | 2011233406 A | 11/2011 |
| WO | 02073587 A | 9/2002 |

OTHER PUBLICATIONS

MacKenzie, Scott, et al, "The Tactile Touchpad", 1997, 5 pages.

MacKenzie, Scott, et al., "A Comparison of Three Selection Techniques for Touchpads", Proceedings of the CHI'98 Conference on Human Factors in Computing Systems, pp. 336-343 New York 1998.

Oniszczak, Aleks, "VersaPad Driver Plus Pack", 1999, 3 pages.

Poupyrev, Ivan, et al., "Tactile Interfaces for Small Touch Screens", 2003, 4 pages.

Poupyrev, Ivan, et al., "Touch Engine: A Tactile Display for Handheld Devices", 2002, 2 pages.

(56) References Cited

OTHER PUBLICATIONS

USPTO, Final Office Action mailed Aug. 1, 2012, U.S. Appl. No. 12/580,002, 23 pages.
USPTO, Non-Final Office Action mailed May 14, 2012, U.S. Appl. No. 13/323,292, 19 pages.
USPTO, Notice of Allowance mailed Jan. 7, U.S. Appl. No. 13/413,639, Jan. 7, 2014.
USPTO, Supplemental Notice of Allowance mailed Mar. 28, 2014, U.S. Appl. No. 13/413,639.

* cited by examiner

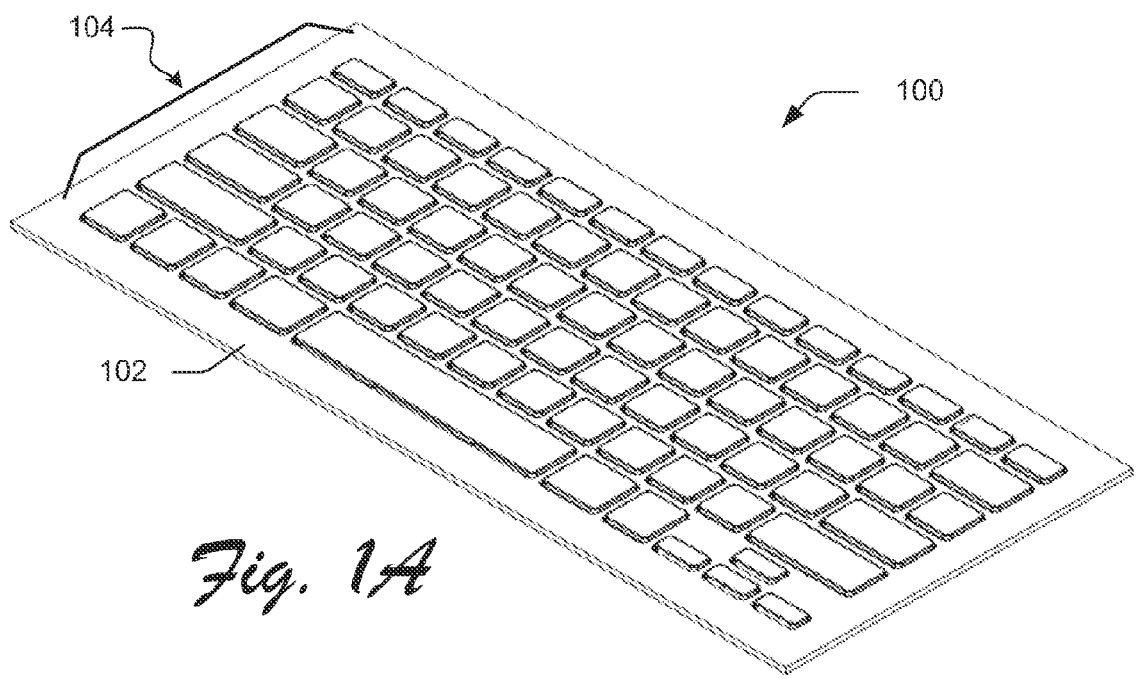
Fig. 1A
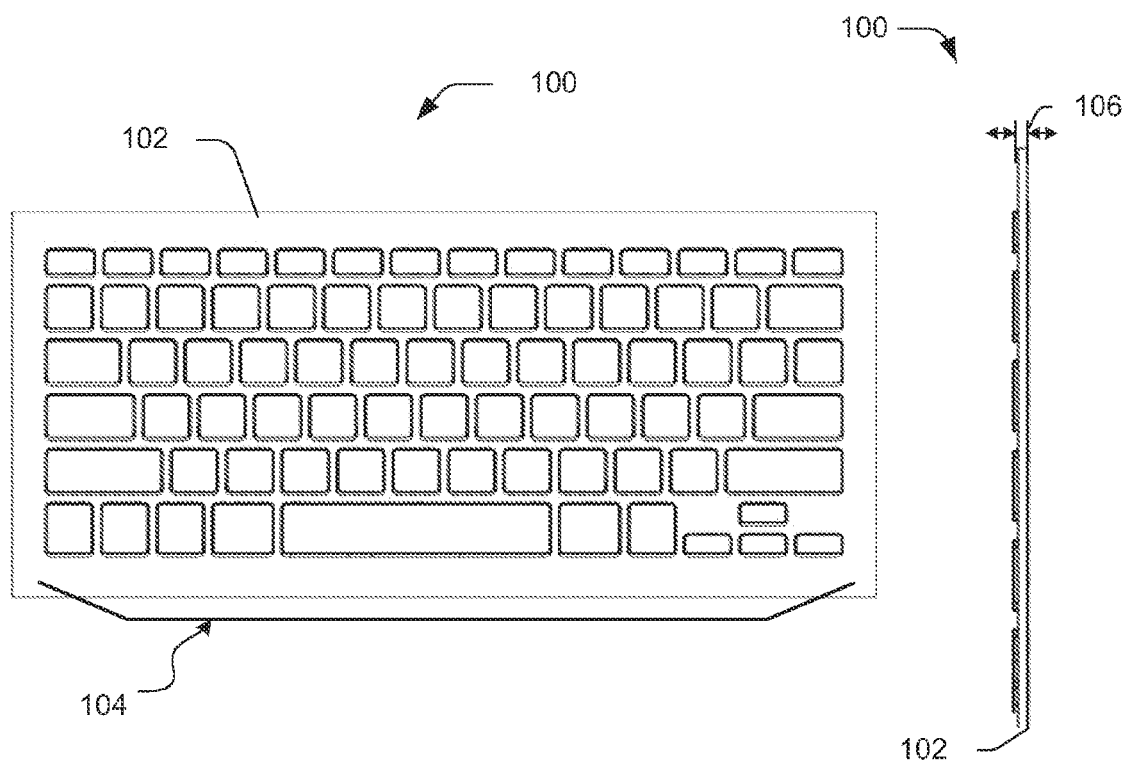
Fig. 1B
Fig. 1C

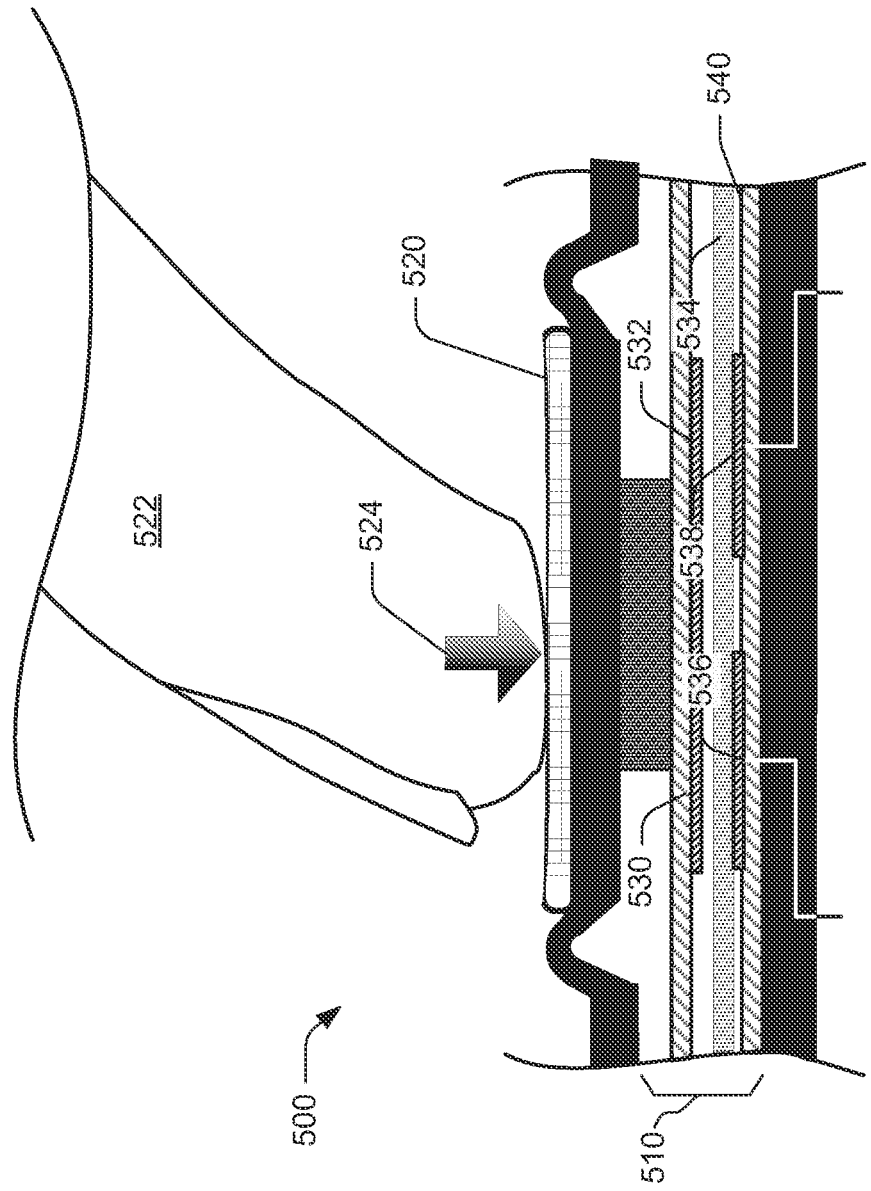

CAPACITIVE KEYSWITCH TECHNOLOGIES

RELATED APPLICATIONS

This application is related to, claims the benefit or priority of, and incorporates in entirety the following U.S. Provisional Patent Applications:

Ser. No. 61/546,652 filed Oct. 13, 2011, which is entitled "Capacitance-Sensing Keyswitch";

Ser. No. 61/450,054, filed Mar. 7, 2011, which is entitled "Force-Sensing Capacitive Keyswitch Matrix".

This application is related to, and is a Continuation of the following U.S. Patent Application:

Ser. No. 13/413,639 filed Mar. 6, 2012, which is entitled "Capacitive Keyswitch Technologies".

In addition, this application incorporates in entirety the following:

U.S. Non-Provisional patent application Ser. No. 13/082,293, filed on Apr. 7, 2011, which is titled "Touchpad with Capacitive Force Sensing";

U.S. Non-Provisional patent application Ser. No. 13/198,610, filed on Aug. 4, 2011, which is titled "Leveled Touchsurface with Planar Translational Responsiveness to Vertical Travel";

U.S. Non-Provisional patent application Ser. No. 13/334,410, filed on Dec. 22, 2011, which is titled "Haptic Keyboard Featuring a Satisfying Tactile Keypress Experience".

BACKGROUND

A conventional keyboard typically utilizes a sensor membrane of at least three layers and one or more non-tactile conductive-based switches to detect key depressions, where non-tactile means that the user feels nothing from switch closure itself (i.e., no feedback). A first portion of a circuit is provided on a first layer, a second portion of the circuit is provided on a second layer and a third non-conductive layer is disposed therebetween. A hole is generally provided in one or more of the layers such that, when a key is depressed, the first circuit portion is electrically coupled to the second circuit portion to complete an electric circuit.

A controller associated with the keyboard detects that a particular key is depressed and sends that information to a processor or other computing device. Multiple keys may be provided in a matrix-like pattern such that a plurality of wiring patterns couples the plurality of keys to the controller. This layout is often referred to as a "keyboard switch matrix."

SUMMARY

Described herein are techniques related to capacitance-based keyswitch technologies. According to one implementation, an apparatus includes a key with a floating electrode. The floating electrode pairs with a fixed electrode and a capacitance may be generated between them. The apparatus has a controller configured to measure the capacitance as the electrodes move relative to each other as the key is depressed and released.

This Summary is submitted with the understanding that it will not be used to interpret or limit the scope or meaning of the claims. This Summary is not intended to identify key features or essential features of the claimed subject matter, nor is it intended to be used as an aid in determining the scope of the claimed subject matter.

BRIEF DESCRIPTION OF THE DRAWINGS

FIGS. 1A, 1B, and 1C are three different views of a thin keyboard that incorporates one or more implementations of the capacitive keyswitches that are configured in accordance with the techniques described herein. FIG. 1A is an isometric view of the keyboard. FIG. 1B is top plan view of the keyboard. FIG. 1C is a side elevation view of the keyboard.

FIG. 6 shows the portion of the keyboard shown in FIG. 6 when the keyswitch is depressed by, for example, a finger.

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Figure 2:
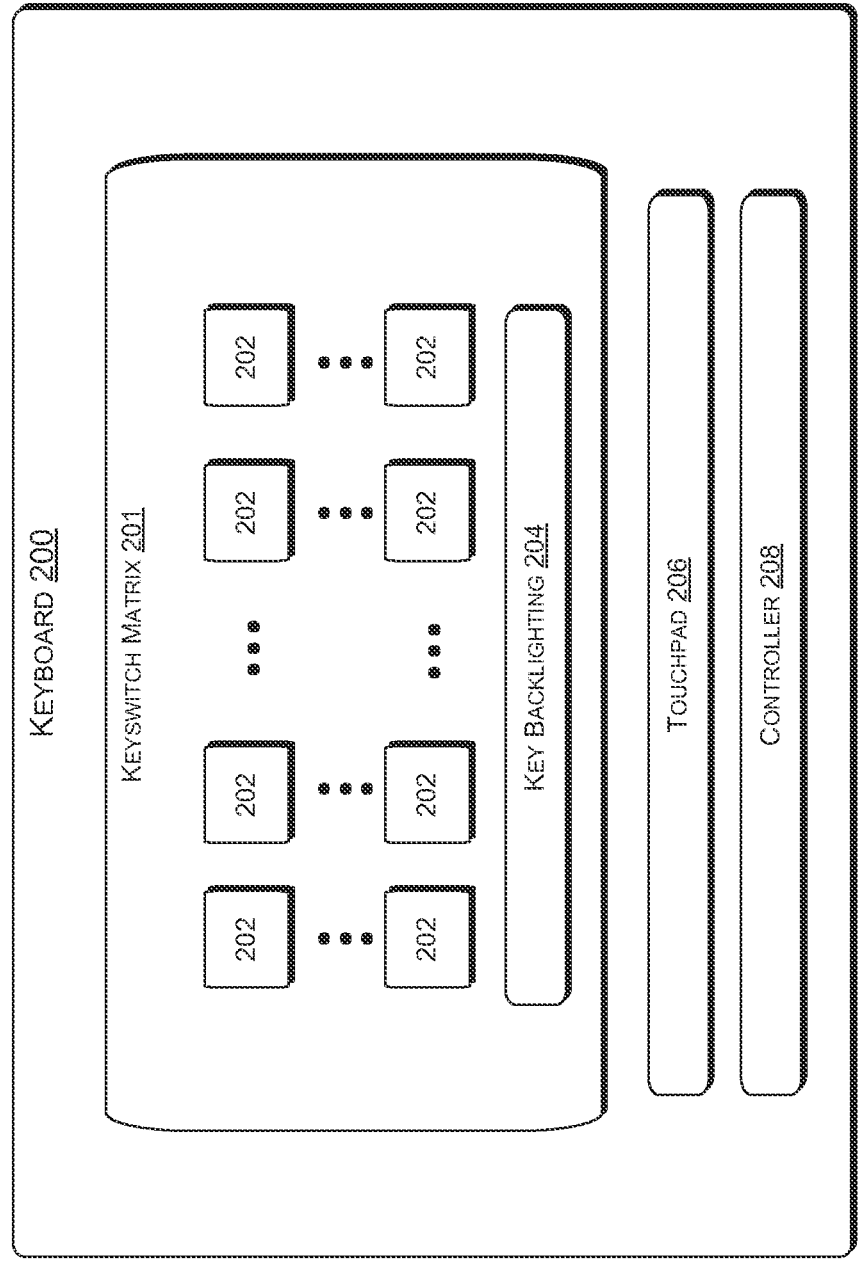
FIG. 2 shows a block diagram of an example keyboard that is configured to implement the techniques described herein.

Described herein are techniques related to a new keyboard switch, which is called a "keyswitch" herein, and associated technologies. According to one implementation, a keypress detection mechanism identifies a keypress without "contacts" making physical contact with each other. Rather than using contacts to determine a keypress, a new keyswitch described herein utilizes capacitive sensors, which are operable to sense capacitance, including measuring incremental changes in capacitance. The new keyswitch may use mutual capacitance between one or more fixed electrodes (i.e., capacitance sensors) below a key and one or more floating electrodes (i.e., capacitance sensors) that is below, attached to, or part of, the moving key.

As noted in the Background section, most traditional non-tactile keyboard switches use at least three layers or membranes. However, the new keyswitch technology described herein may use less than three membranes (i.e., layers or sheets). Indeed, some implementations may employ only one membrane.

With the new technology described herein, each keyswitch has a corresponding capacitive sensor that measures the force at which the user presses that key as a calibrated function of the change in capacitance measured or sensed by the sensor. The keyboard detects a keypress of a particular key when the measured force being applied to the corresponding particular key exceeds a predefined and/or adjustable threshold. When multiple keyswitches are present, such as in an example keyswitch matrix, keypresses of each key may be detected independently of the keypresses of others. Consequently, multiple keys may be pressed simultaneously regardless of their location on the keyboard.

Exemplary Keyboard

FIGS. 1A-1C offer three different views of an exemplary keyboard 100 that is configured to implement the techniques described herein. FIG. 1A is an isometric view of the exemplary keyboard 100. FIG. 1B is top plan view of the exemplary keyboard 100. FIG. 1C is a side elevation view of the exemplary keyboard 100. As depicted, the exemplary keyboard 100 has a housing 102 and an array of keys 104.

As can be seen by viewing the exemplary keyboard 100 from the three points of view offered by FIGS. 1A-1C, the exemplary keyboard is exceptionally thin (i.e., low-profile) in contrast with a keyboard having conventional full-travel keys. A conventional keyboard is typically 12-30 mm thick (measured from the bottom of the keyboard housing to the top of the keycaps). Examples of such keyboards can be seen in the drawings of U.S. Pat. Nos. 0,278,239, 0,292,801, 0,284,574, 0,527,004, and 0,312,623. Unlike these traditional keyboards, the exemplary keyboard 100 has a thickness 106 that is less than 4.0 mm thick (measured from the bottom of the keyboard housing to the top of the keycaps). With other implementations, the keyboard may be less than 3.0 mm or even 2.0 mm.

The exemplary keyboard 100 is shown as a stand-alone keyboard rather than one integrated with a computer, like the keyboards of a laptop computer. Of course, alternative implementations may have a keyboard integrated within the housing or chassis of the computer or other device components. The following are examples of devices and systems that may use or include a keyboard like the exemplary keyboard 100 (by way of example only and not limitation): a mobile phone, electronic book, computer, laptop, tablet computer, stand-alone keyboard, input device, an accessory (such a tablet case with a build-in keyboard), monitor, electronic kiosk, gaming device, automated teller machine (ATM), vehicle dashboard, control panel, medical workstation, and industrial workstation. Moreover, while a touchpad and other input mechanisms are not shown on the keyboard 100, alternative implementations may have a touchpad or other input mechanism integrated within the housing or chassis of the keyboard 100.

FIG. 2 shows a simplified block diagram of an example keyboard that is configured to implement the techniques described herein. It is noted that certain well-known features are omitted for the purposes of clarity and simplicity of discussion. The exemplary keyboard 200 includes an exemplary keyswitch matrix 201 that is coupled to a plurality of keyswitches 202. The keyswitch matrix 201 may optionally be provided with backlighting 204 to light the keyswitches 202 or their associated touchsurfaces (e.g., key caps) from below. The keyboard 100 may also optionally include a touchpad 206. The keyboard 100 may have one or more controllers 208 to monitor the keyswitch matrix 201 and/or the touchpad 206 and to provide output to a computer processor (not shown) associated with or electrically coupled to the keyboard.

Exemplary Combination Keyboard/Touchpad Controller

In a conventional conductivity-based keyboard, such as a laptop computer keyboard, the keyswitch matrix has required its own dedicated controller and the touchpad has its own separate dedicated controller. These two distinct controllers have been required because the keyboard has traditionally been a matrix of non-tactile conductivity-based keyswitches while the touchpad employs capacitive technology to locate a user's finger on the touchpad itself To complicate the matter, and to ensure that the two controllers will perform properly in the final installation, keyboards are often manufactured such that a third party that provides the touchpad and/or the touchpad controller must include the keyboard controller on or within the touchpad controller circuit board (or, conversely, the touchpad controller is incorporated into the keyboard controller) before the assembly can be incorporated into the final keyboard product. This process is not only expensive and time consuming, but it can also limit the abilities and marketability of the touchpad and keyboard manufacturers' products.

An apparatus, such as keyboard 200 shown in FIG. 2, includes two capacitance-based systems: the capacitance-based keyswitch matrix 201 and the capacitance-based touchpad 206. A single controller 208 is configured to receive signals from both the capacitance-based keyswitch matrix 201 and the capacitance-based touchpad 206. The controller 208 identifies whether a signal originates from the keyswitch matrix 201 or from the touchpad 206 using conventional logic circuitry and/or using separate inputs for the two capacitive based systems. The controller 208 not only identifies whether the input signal to the controller 208 originates from the keyswitch matrix 201 or from the touchpad 206, but the controller 208 also may determine what user input the signal represents. Alternatively, the raw sensor data may be sent to a host computer or processor for its own use.

For example, the controller 208 may determine which key was pressed in the keyswitch matrix 201, if gesturing was detected at any of the keys, if applicable, and so forth. Similarly, the controller 208 identifies presence, motion, gestures, and so forth made with regard to the touchpad 206 as is well known in the touch pad arts. The controller 208 then provides one or more signals to a processor of a computing device so that the input provided by the user may be used by the computing device. Thus, the multiple controllers previously required for devices that combine a conductivity based keyswitch matrix and a capacitance-based touchpad are replaced in the novel apparatus by a single controller that controls both the capacitance-based keyswitch matrix and the capacitance-based touchpad. Examples of touchpad capacitance-based controllers that could be incorporated and/or used to control both the capacitance-based keyswitch matrix and the capacitance-based touchpad include those produced by companies such as STMicroelectronics (e.g., controller model STM-TOSE) and Cypress Semiconductor Corporation (e.g., Trutouch controller models).

In other implementations, the capacitance-based keyswitch matrix 201 may have more than one sensor per key. In those implementations, multiple sensors per key may be used, for example, to detect gestures by the user and/or the user's finger separately from a floating electrode. In some implementations, the capacitance-based keyswitch matrix may be arranged much like the touch sensors of a touchpad where every driven electrode is sensed by four or more sensor electrodes to net higher resolution and more spatial data.

Exemplary Keyswitch

Figure 3:
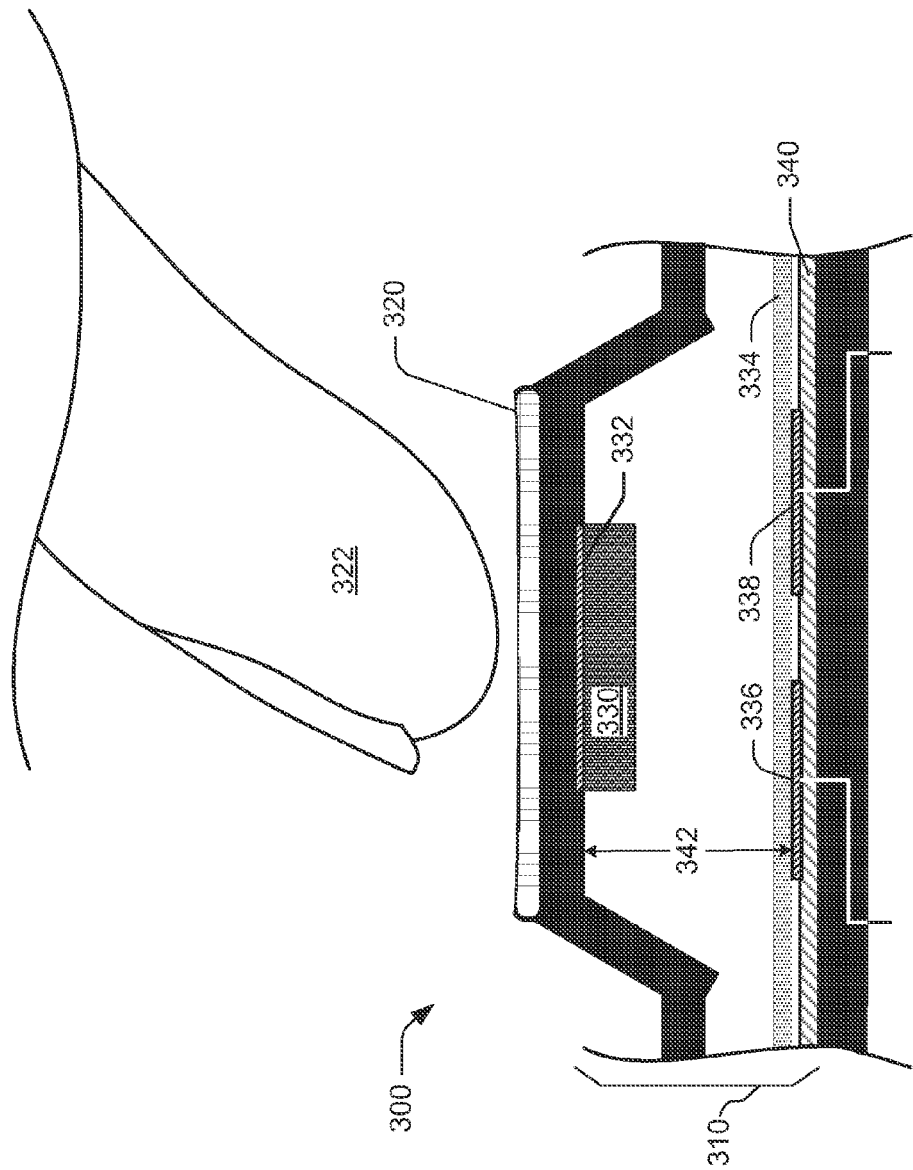
FIG. 3 shows a cross-sectional view of a portion of a keyboard that includes an example implementation of the keyswitch.

FIG. 3 shows a cut-away of an example key assembly 300 of a portion of a keyboard that includes an example implementation of a keyswitch 310, which may be one keyswitch 202 of the keyswitch matrix 201. As shown in the cut-away portion of the single key of the keyboard, the example keyswitch 310 forms, at least in part, a keypress detection mechanism for that key. The assembly 300 includes a touch surface such as a key cap 320 (herein referred to as simply "key") with a user's finger 322 or other pressing mechanism hovering thereover.

The example keyswitch 310 includes a key cushion or spacer 330, a floating upper electrode 332, a dielectric layer 334, a pair of lower electrodes 336, 338, and a lower membrane 340. Between the upper and lower electrodes is a defined gap 342. There may be air in that gap or just a deformable material to allow the upper electrode 332 to move down but be non-conductive between the upper and lower electrodes.

The electrodes (332, 336, 338) include a conductive material suitable for use in a capacitor. Examples of suitable material include metal (e.g., silver, iron, aluminum, copper, etc.) or a conductive film (e.g., indium tin oxide), or a permanent magnet. According to an implementation, one of the lower electrodes (e.g., 336) is connected to a row and the other of the lower electrodes (e.g., 338) is connected to a column of a keyswitch matrix.

Figure 4:
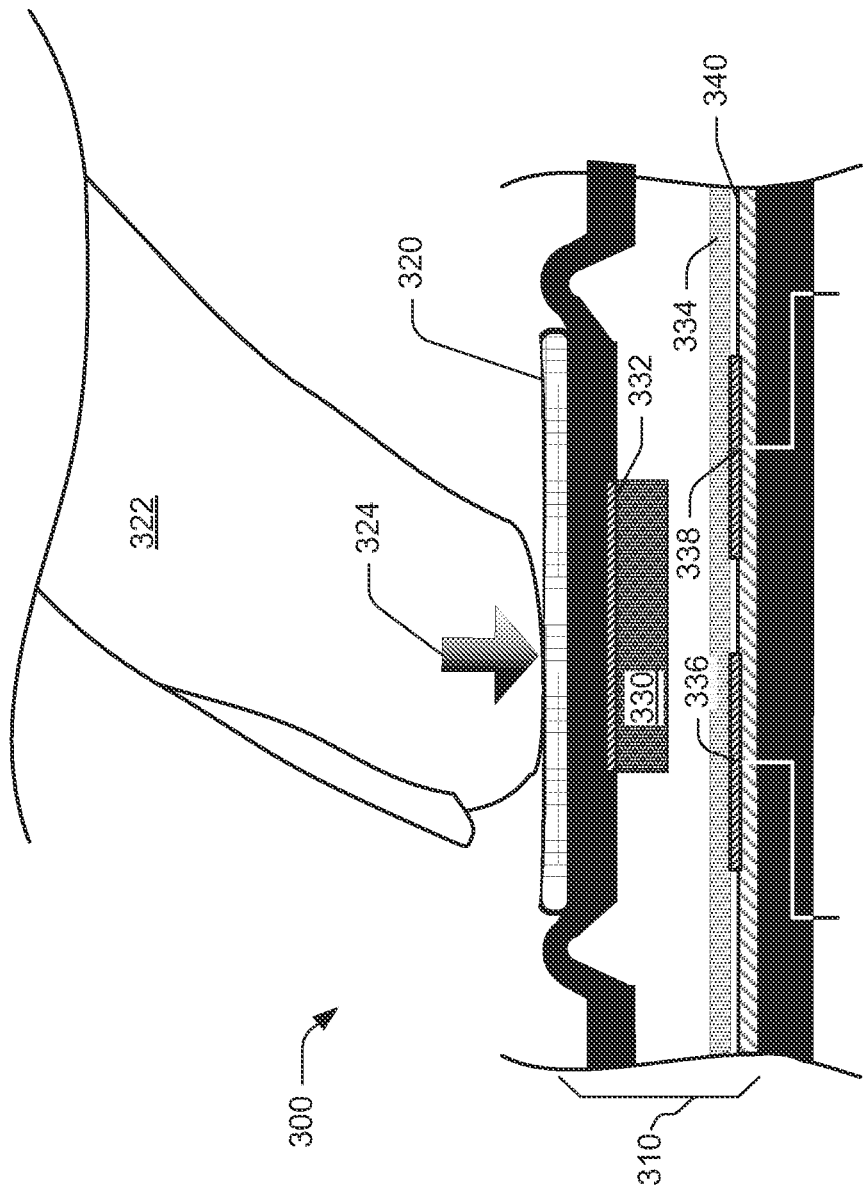
FIG. 4 shows the portion of the keyboard shown in FIG. 3 when the keyswitch is depressed by, for example, a finger.

FIG. 4 shows the same components as shown in FIG. 3, but the finger 322 has pressed down (as noted by vector 324) on the key 320 and caused the spacer 330 and the floating upper electrode 332 to move down. This movement causes a change in capacitance measured across the pair of lower electrodes (336, 338) or between electrode 332 and either or both electrodes 336 and 338. This signal, representing the change in capacitance, is sent to the corresponding controller where the key being pressed is identified and the force with which the user is pressing down on the key may be determined based upon the measured change in capacitance.

According to an implementation, the keyswitch 310 is an analog switch. The lower electrodes 336, 338 are fixed capacitive sensors and the floating upper electrode 332 is a movable, adjustable, and/or variable capacitive sensor. The movement of the variable sensor relative to the fixed sensors is what produces the analog signal that is used to determine switch closure. Consequently, a measured capacitance and the timing of changes in measured capacitance may be used to define a threshold or a range that indicates switch closure and/or switch opening. Thus, the keyswitch may be optimized in order to detect a keypress with a minimal depression, with a maximum force keypress, or any suitable keypress therebetween.

Other implementations might not include the dielectric layer 334. Instead, they may use mechanical stops that prevent the electrodes from making contact with each other.

Alternative Exemplary Keyswitch

Figure 5:
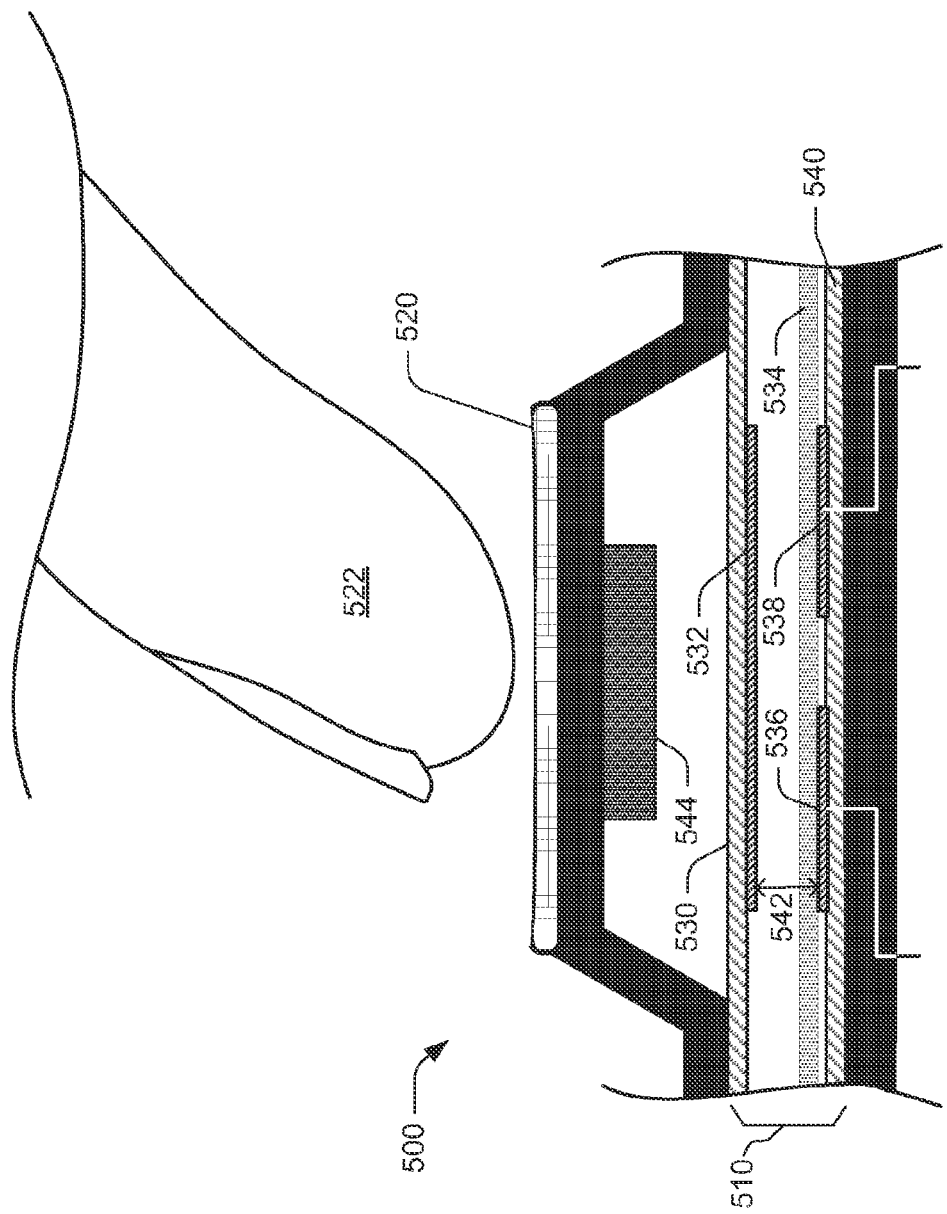
FIG. 5 shows a cross-sectional view of a portion of a keyboard that includes an alternative example implementation of the keyswitch.

FIG. 5 shows a cut-away of an alternative exemplary assembly 500 of a portion of a keyboard that includes an exemplary implementation of the new keyswitch 510. As shown, the exemplary keyswitch 510 has similar features to keyswitch 510 and, similarly, forms a keypress detection mechanism for that key. The assembly 500 includes a key 520 with a user's finger 522 hovering thereover.

The exemplary keyswitch 510 includes an upper membrane 530, a floating upper electrode 532, a dielectric layer/spacer 534, a pair of lower electrodes 536, 538, and a lower membrane 540. The floating upper electrode 532 is positioned under the key 520 and on, over, under, or within upper membrane 530. Unless the context indicates otherwise, the "floating" nature of the electrode refers to the fact that the electrode is not grounded, electrically. Thus, it forms part of a mutual capacitive sensor.

As depicted, the floating upper electrode 532 is positioned under the key 520 on the underside of upper membrane 530. Between the upper and lower electrodes is a defined gap 542. There may be air in that gap or just a deformable material so as to allow the upper electrode 532 to move down but be non-conductive between the upper and lower electrodes. In some scenarios, the membrane 530 may be between the upper electrode 532 and lower electrodes 536, 538 and may act as a dielectric. In such an instance, the dielectric layer/spacer 534 may be redundant and, thus, unnecessary.

An optional spacer 544 may be placed between the key 520 and the keyswitch 510 to assist in the movement and/or manipulation of the membrane 530 and to optimize performance, sensory appeal, and other similar features of the keyboard incorporating the assembly 500.

FIG. 6 shows the same components as shown in FIG. 5, but the finger 522 has pressed down (as noted by vector 524) on the key 520 and caused the upper membrane 530 and the floating upper electrode 532 to move downward toward the lower electrodes 536 and 538. This movement causes a change in capacitance measured across the pair of lower electrodes (536, 538) or between electrodes 532 and either or both electrodes 536 and 538. This signal, representing the change in capacitance, is sent to the corresponding controller/logic where the key being pressed is identified and the force with which the user is pressing down on the key may be determined (based upon the measured change in capacitance).

In both depicted example keyswitches (and with other implementations that are not depicted), the user's finger 322 may act participate in the capacitance relationship between the floating and fixed electrodes. In some implementations, the finger may be the only floating electrode. In other implementations, the floating electrode may be a combination of the conductive material of the key and the finger itself.

Exemplary Electrodes

FIGS. 7A-8B illustrate examples of configurations of electrodes and membranes that are especially for use with implementations like the alternative exemplary assembly 500.

Figure 7A:
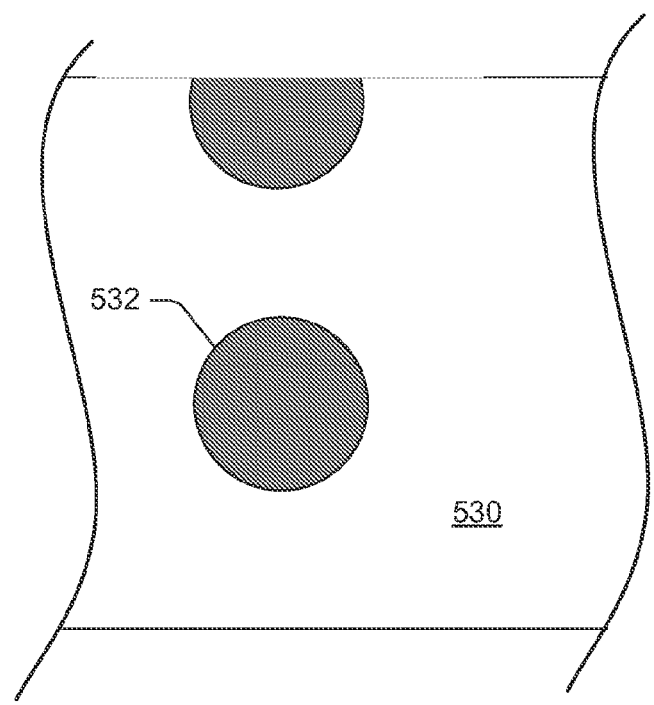
FIG. 7A shows a plan view of an upper membrane and a floating upper electrode of an exemplary keyswitch.
Figure 7B:
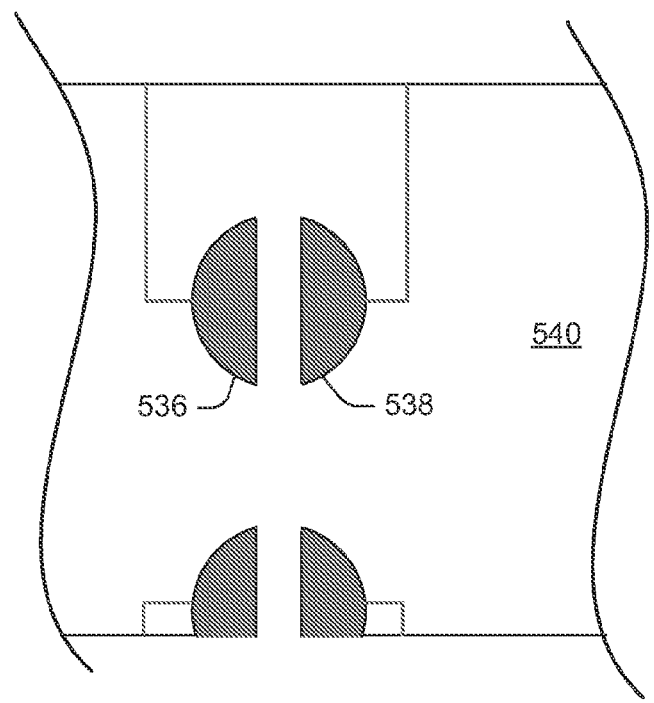
FIG. 7B shows a plan view of a lower membrane and lower electrodes of an exemplary keyswitch.

FIG. 7A shows a bottom plan view of the upper membrane 530 and the floating upper electrode 532. FIG. 7B shows a top plan view of the lower membrane 540 and the pair of lower electrodes 536, 538 as originally shown in FIGS. 5 and 6. The electrodes 532 and the conductive lines may be printed on the membrane 540 using conductive ink such as low-resistance silver conductive ink. The conductive lines may be laid out in any configuration. For example, to avoid key ghosting, it may be laid out in a manner that allows each keyswitch to be independently monitored. Moreover, while the floating upper electrode 532 is shown on the underside of upper membrane 530 and the lower electrodes 536, 538 are shown on upper surface of the lower membrane 540, the electrodes and traces could be on the opposite sides of the respective membranes.

According to an implementation, one of the lower electrodes (e.g., 536) is connected to a row and the other of the lower electrodes (e.g., 538) is connected to column of the keyswitch matrix circuitry.

Figure 8A:
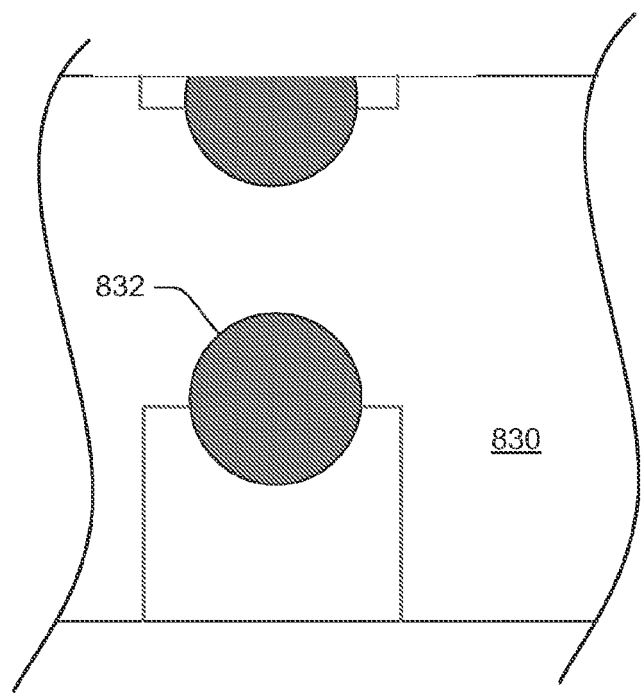
FIG. 8A shows a plan view of an alternative upper membrane and floating upper electrode of an alternative exemplary keyswitch.
Figure 8B:
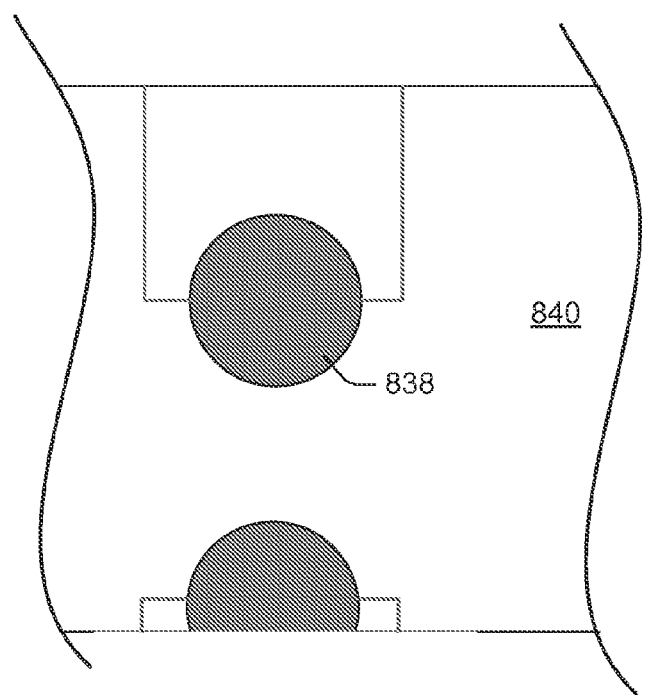
FIG. 8B shows a plan view of an alternative lower membrane and lower electrodes of an alternative exemplary keyswitch.

FIGS. 8A and 8B show an alternative implementation of the electrodes. In this implementation, collectively, the upper and lower electrodes form the first and second plates of the capacitive circuit. Accordingly, one of the electrodes may be coupled to the row while the other of the electrodes may be coupled to the column in the keyswitch matrix. FIG. 8A shows a bottom plan view of an upper membrane 830 and an upper electrode 832. FIG. 8B shows a top plan view of a lower membrane 840 and a lower electrode 838. Of course, with any implementation of this keyswitch the orientation (e.g., upper, lower, left, right) of the electrodes is based upon the needs of the rest of the keyboard design.

Although shapes and arrangements of electrodes are shown by way of example, other shapes or arrangements of electrodes may, of course, be utilized without departing from the spirit and scope of the claimed subject matter. Moreover, although the electrode shapes illustrated in FIGS. 7A-8B are shown with reference to one implementation of keyswitch 510 (originally shown in FIGS. 5 and 6), similar electrode layouts and shapes may be utilized for other keyswitches, such as keyswitch 310 (originally shown in FIGS. 3 and 4). For example, the electrode 332 may be provided on a portion of key 320 rather than on the upper membrane as shown in FIG. 7A.

The floating upper electrode 332 depicted in FIGS. 3 and 4 (or upper electrode 532 in FIGS. 5 and 6) may be composed of electrically conductive material. Examples of suitable conductive material that the electrode may include or be formed from include (but are not limited to): silver, iron, aluminum, gold, brass, rhodium, iridium, steel, platinum, tin, indium tin oxide, titanium, copper, or other suitable conductive material. Other materials may, of course, be utilized without departing from the spirit and scope of the claimed subject matter.

Magnetic materials, such as permanent magnets may be a suitable conductive material for the floating upper electrode 332. The most common types of such magnets include neodymium iron boron; samarium cobalt; alnico; and ceramic. In addition, a magnet in a key may have dual function of the floating upper electrode 332 described herein and as the ready/return mechanism as described in U.S. Non-Provisional patent application Ser. No. 13/198,610. In this way, the capacitive keyswitch technology described herein is operable to detect a key as it descends down (or moves up) by a change in capacitance resulting from the key's magnet moving in the capacitance field.

Alternatively, a spring, elastomeric dome, user's finger, or any other urging mechanism with conductive properties may act as the floating upper electrode as it moves in correspondence to the movement of the key.

The key switches in the keyswitch matrix may be connected through a sensor membrane that connects an array of capacitance-sensing key sensors (e.g. electrodes 332, 336 and 338) operating as an analog switch, to logic within the controller or elsewhere in the keyboard. Each of the key sensors is positioned generally under a particular key of a keyboard. The key sensors provide capacitance information through signals provided to the sensor logic in response to a user applying a downward force to a corresponding key.

Figure 9:
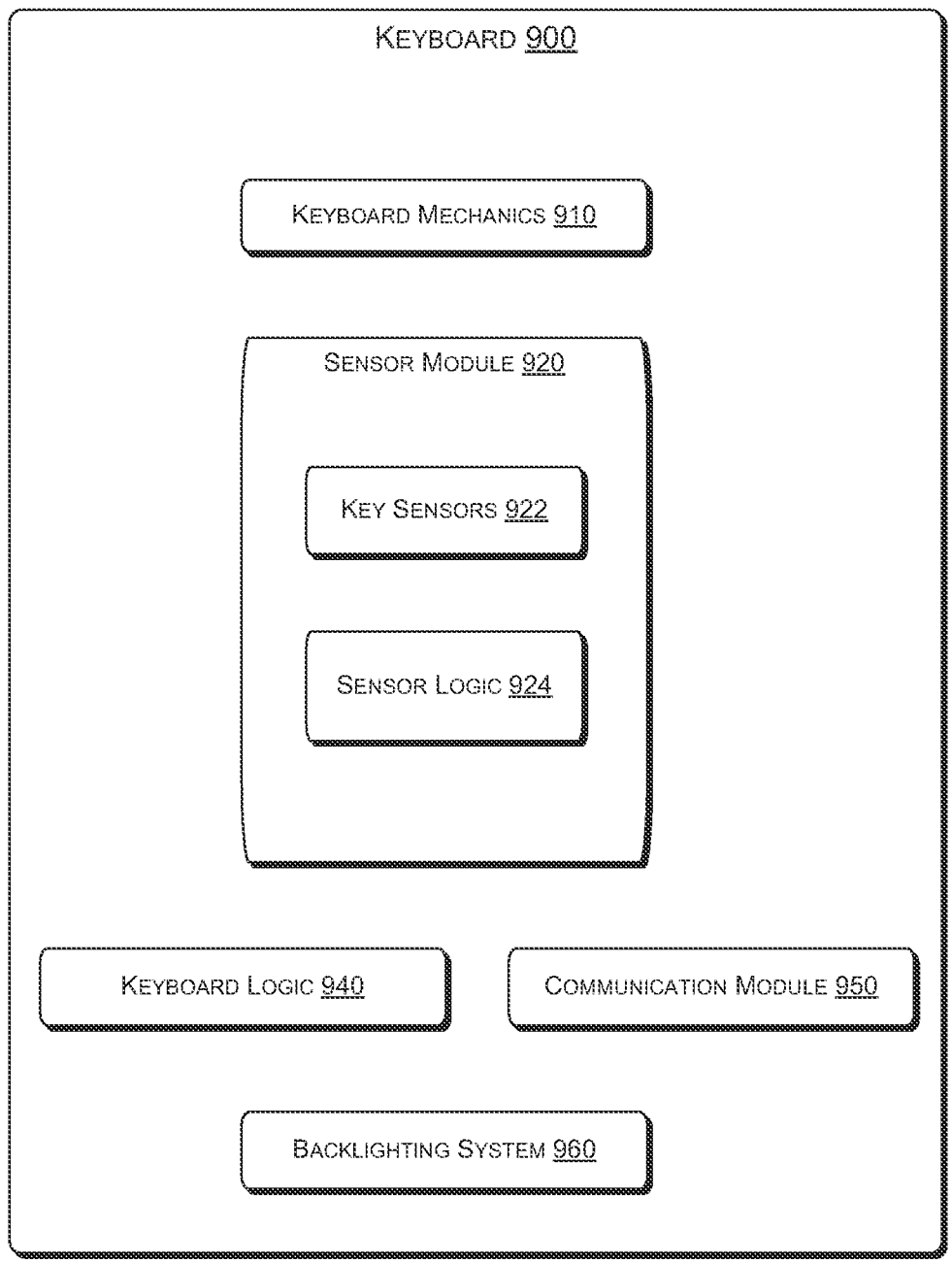
FIG. 9 shows a block diagram of components of an example keyboard that is configured to implement the techniques described herein.

FIG. 9 illustrates some example components in accordance with one or more embodiments, such as an example keyboard 900. The example keyboard 900 includes keyboard mechanics 910, a sensor module 920, keyboard logic 940, a communication module 950, and a backlighting system 960.

The keyboard mechanics 910 include the mechanical components of the example keyboard 900, such as those described above for FIGS. 1A-1C and 3-6.

The sensor module 920 includes key sensors 922 and sensor logic 924, which may reside in a controller (not shown) or elsewhere on the keyboard. The sensor module 920 also includes circuits operatively connecting and 510 are examples of the key sensors 922.

The key sensors 922 indicate whether a user has actually pressed the key. In addition, each key sensor may also signal to the appropriate components of the example keyboard 900 how hard and/or how fast the user is pressing the key down based on the capacitance value, its relevant change, and/or its rate of change.

Conventional keyswitches were typically binary on-off type switches. The conventional keyswitches send the appropriate signal whenever the user pressed the key down hard enough to make an electrical contact under the switch. Unlike conventional keyswitches, the key sensors of the example keyboard 900 send a series of signals or a continuous signal that indicate the force at which the user is applying to the keycap. The force indicated by the sensor signal and/or the timing of that signal determines when/whether to indicate that the user is selecting that particular key.

The sensor logic 924 receives the key-sensing signals from the sensors 922 and responds accordingly to send signals to the keyboard logic 940.

The keyboard logic 940, which may reside in the controller or elsewhere in the keyboard 900, interprets the signals sent from the sensor logic 924 to determine which key code (i.e., scan code) to send to the host computer. In some implementations, the keyboard logic 940 may be implemented by a combo keyboard/touchpad controller, such as controller 208 discussed above.

The communications module 950 is operatively connected through a wired or wireless connection to the host computer. The communications module 950 receives the key code from the keyboard logic 940 and sends that code on to the host computer.

The backlighting system 960 includes one or more lighting elements that are positioned so that a user, through at-least-partially transparent and/or translucent keycaps (or flexible platform), can see the light. In some implementations, the backlighting system 960 may be designed to light specific keys or specific groups of keys.

Any suitable hardware, software, and/or firmware can be used to implement the sensor logic 924, the keyboard logic 940, and the communication module 950. The hardware, software, and/or firmware may be user configurable.

The controller the sensor logic 924, and/or the keyboard logic 940, may be configured such that when a given signal exceeds a predetermined threshold for a particular key, the logic associated with the controller determines that the key is pressed. Based upon this, a signal (e.g., scan code) may be sent to the host processor or computing device that identifies the particular key has been pressed. The controller may further process capacitance-based information from a touch pad as discussed above.

Automatic and/or manual calibration between the capacitance and the force needed to move the key particular distances can be done to ensure the user has a consistent input experience regardless of orientation or manufacturing tolerances. For example, automatic calibration can be basic, as in resetting the force sensors to zero on startup, or advanced, as in using an accelerometer to determine operating angle and compensating for the gravity effects of the touchsurface at that angle.

Gesture Detection

Certain keys may be configured to detect certain gestures from a user or object. For example, a key, such as a spacebar key, may be provided with multiple upper and lower electrodes along the length of the key either forming distinct keyswitches or operating as a single keyswitch. The controller may be configured to sense and differentiate between a user swiping a finger across the key, depressing the key fully and evenly, and/or depressing the key in a non-uniform manner, such as depressing one side of the spacebar key unevenly. Similarly, other gestures that affect the timing, force, or capacitance of the keypress may be monitored by the controller. Logic within the controller may compare the characteristics of the keypress to determine if a recognized gesture was input by the user.

For example with a "swipe" gesture or if additional capacitance sensors are designed to sense the user's proximity rather than the upper electrode, the controller could do a variety of actions in response to such detected gestures or proximity. Examples of such actions include 1) instruct the backlight controller to turn on illumination or adjust its intensity; 2) instruct the computer or operating system to wake up from sleep mode; 3) report to the operating system the gesture for higher level processing.

Gesturing at a higher level could report the movement of a person's hand across the keyboard or bezel presuming that the sensors could detect it. Detecting gestures involves interpreting the user's input in a non-keypress manner. A key closure is defined in implementations describe herein to be a keyswitch crossing a certain sense level (e.g., capacitance measurement) and/or a keyswitch changing value at a certain rate (e.g., rate of change of capacitance). A gesture on a keyboard would be defined, for example, by the sequential "closing" of three or more adjacent keyswitches within a certain length of time.

Anti-Ghosting

In a conventional keyboard, a controller associated with the keyboard detects that a particular key is depressed and sends that information to a processor or other computing device. Multiple keys may be provided in a matrix-like pattern such that a plurality of wiring patterns couple the plurality of keys to the controller. This layout is often referred to as a "keyboard switch matrix." Most keyboards have only the switch at each intersection, which can cause so-called "ghost keys" and/or "key jamming" when multiple keys are pressed.

Traditional solutions to the ghosting and jamming key problems include rearranging the wires such that important key combinations do not exhibit the ghosting problem. Additionally or alternatively, extra wires may be utilized to create more unambiguous cases, though such creates additional processing and cost. Keyboards have been made with a diode at every key so that each key can be detected individually; however, because this requires printing a circuit board with potentially over a hundred diodes, it is relatively expensive.

Key ghosting plagues existing keyboard technology that uses a conventional keyboard switch matrix for their membrane circuit. The keyswitches and matrices described herein solve the key ghosting problem by employing a mutual capacitance sensor matrix where all the sensors are independent. The mutual capacitance matrix may be able to switch itself into a self-capacitance matrix in order to do proximity detection. In this way, the device may be aware of a user approaching and then wake up or light up the keyboard. To prevent accidental wake-up, sensor could detect that a lid of a laptop is closing so that action would not cause the computer to wake up.

Lighting Mechanism

One of the layers used for the keyswitch (e.g. layer 340, layer 334, etc.) may also be used for the light-plate membrane within the keyboard. Generally speaking, a light-plate membrane is a well-known mechanism used to backlight the keyboard. The lighting sources of a backlighting system can be implemented using any suitable technology known in the art. By way of example and not limitation, light sources can be implemented using LEDs, light pipes using LEDs, fiber optic mats, LCD or other displays, and/or electroluminescent panels to name just a few. For example, some keyboards use a sheet/film/membrane (aka, "light plate") with light emitters on the top side of the sheet/film and light diffusers located under each key.

With one or more implementations, the lower electrode may be printed/placed on top of, within, or underneath the light-plate membrane. Since the capacitance sensing works through the light-plate membrane on which the light emitters and diffusers located on/in the sheet/film/membrane, the lower electrode in or underneath the light sheet/film/membrane. The light plate may operate as an insulating layer (e.g., layer 334) between the upper and lower electrodes.

Thus, unlike the traditional approach that required three thick layers and adhesive, the keyswitch described herein may be implemented as a single layer or two layers. With traditional non-tactile conductive-based switches technology, each layer (of the three) has a minimum thickness, that thickness allows each layer to maintain rigidity so that none of them collapse on each other during a press, and also enabled efficient screen-printing and assembly. Thus, the thinnest conventional keyswitches are relatively thick with respect to a keyboard with overall thickness of <4 mm.

According to one implementation of the new keyswitch technology, the upper electrode may be provided on the key cap, the light plate may comprise or printed on an insulting layer (e.g. layer 334), and at least one electrode of the capacitive keyswitch may be in or underneath (i.e., on the underside of) the same layer (e.g. layer 334) as the light plate. Thus, the effective thickness of the keyswitch may be reduced to the thickness of one support layer.

Figure 10:
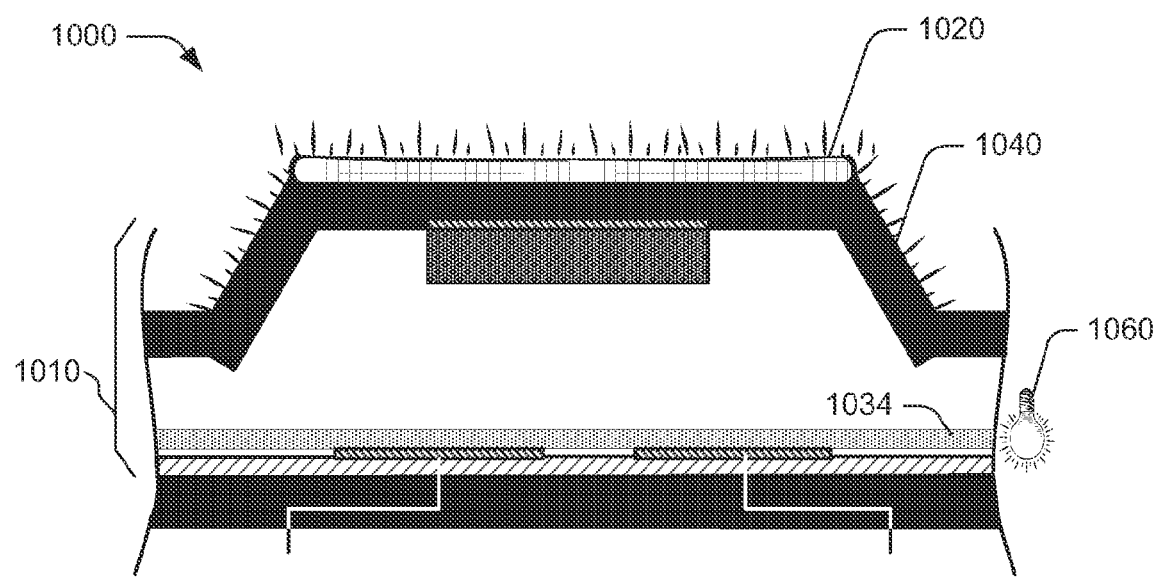
FIG. 10 shows a cross-sectional view of a portion of a keyboard that includes an example implementation of the keyswitch implemented with a light-plate membrane.

FIG. 10 is a cross-section of a cutaway of one example assembly 1000 of an example backlit keyboard. The example assembly 1000 includes a keycap 1020, which may be partially or fully translucent and/or transparent. The keycap 1020 is with (e.g., positioned on top of) a translucent and/or transparent elastomeric key support 1040. The keycap 1020 movement is detected by a keyswitch 1010, which may be similar or identical to keyswitch 310. Other portions of the keyboard, such as the keyboard frame and/or bezel are not shown for the sake for simplicity Unlike example assemblies shown in FIGS. 3-6 discussed above, this example assembly 1000 includes a keyboard backlighting system, which is schematically represented by lighting element 1060 (i.e., backlighting elements). The lighting element 1060 (and possibly others like it) is within a space formed within the keyboard and may be above, below, or level with the insulating layer 1034 of keyswitch 1010. If the lighting element 1060 is positioned to provide light from under the insulating layer 1034, the insulating layer may be transparent and/or translucent to allow the light to pass by and/or through the key cap 1020. In that case, the insulating layer 1034 may be, for example, glass or plastic.

A keyboard backlighting system may include lighting from just above the insulating layer, from just under the insulating layer or from both areas. Additionally or alternatively, the light may be provided through the insulating layer. According to an example implementation, the insulation layer 1060 has diffusion properties to ensure that light is redirected and scattered evenly to provide light beneath the keycaps. Regardless, the lighting comes from under the keycaps as shown the lines of light emanation shown extending from keycap 1020 and elastomeric key support 1040.

The lighting element 1060 may be any suitable low-power lighting component, such as (but not limited to) light emitting diodes (LEDs), Electroluminescence (EL), radioactive ink, fluorescent light, and the like.

With the keycaps (such as keycap 1020) and/or the key support 1040 being translucent and/or transparent, the light from the backlighting system backlights the keyboard. For example, a user may see light through the keycaps 1020. Alternatively, the user may see light coming around the keycaps 1020 and through the key support of each key. Alternatively still, the user may see light coming through both the keycaps 1020 and the key support 1040.

In other implementations, the keys may have gaps around the keycap instead of a key support around the periphery of the keycap. In those implementations, the light may emit from the gaps around the keycap.

With one or more implementations, the lower electrodes may be printed or laminated directly to the light plate and may be disposed above, below, or on both side of the light plate. In addition, the light plate may be on a first layer and the lower electrodes on a second different layer. With this arrangement, the light plate may be above or below the electrodes. If above, the light plate may act as the insulating or dielectric layer in some embodiments.

Presence Sensing

Generally speaking, presence sensing can be implemented as a "far field" sensing option. The device senses the user several millimeters above the user interface surface (e.g., keys). The controller may be configured to detect changes in capacitance values between the upper electrode and lower electrode and/or between either of the electrodes and a user's finger or stylus. For example, capacitance could be measured relative to an upper magnetic electrode such that the controller could detect when a user's body is near or touching one of the keys as such presence has a characteristic capacitance different from that of a metallic conductor used to detect the keyswitch force.

When the user depresses the key, thus moving the upper electrode toward the lower electrode, the changing capacitance value may be monitored to determine that the user is depressing that particular key. By utilizing presence sensing the computing device may be turned 'on' when a user's fingers touch the keys, even if no force is applied. Similarly, the detection of the presence of a user may trigger keyboard lighting or other keyboard feature that otherwise may be turned off to conserve power.

Method of Processing Capacitance Measurements

Figure 11:
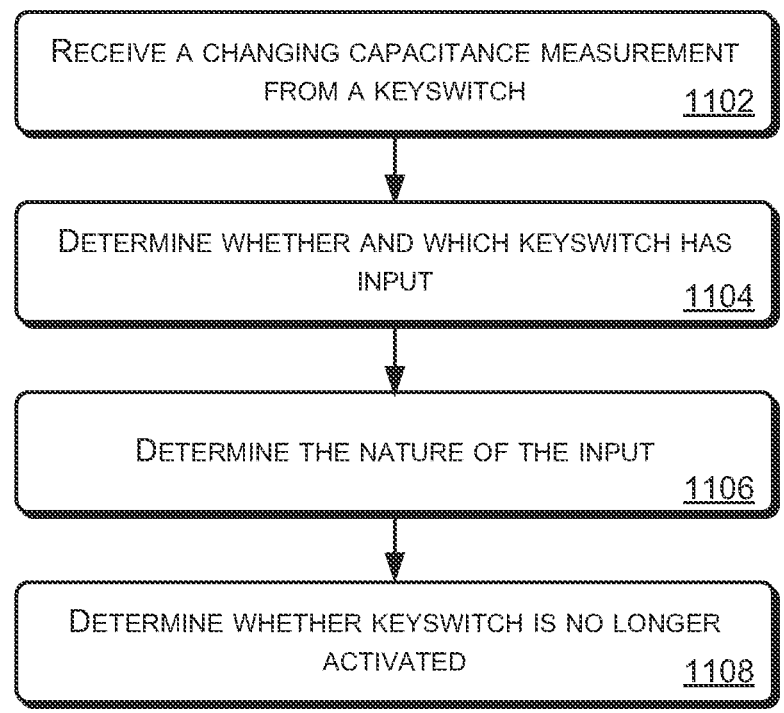
FIG. 11 shows a flow diagram of an example process that implements the techniques described herein.

FIG. 11 is a flow diagram illustrating an example process 1100 for implementing the techniques described herein for processing capacitive measurements from keyswitches described with reference to FIGS. 2-6.

As shown here, the process 1100 begins with operation 1102, where a controller (such as controller 208) receives changing capacitance measurements from a keyswitch. The measurements are received as one or more analog signals. In at least some implementations, these signals are converted to a digital representation (e.g., a quantized numerical value) in the controller corresponding to the capacitance, or time it took to charge the capacitive electrode. A metallic top electrode may cause the capacitance to be reduced (shorter charge time, thus lower numerical value) whereas a nonmetallic electrode, such as a human finger, would cause an opposite effect (longer charge time, thus higher numerical value).

At operation 1104, the controller determines whether an input has been received at a keyswitch and which keyswitch. This determination may be made based on an absolute threshold value or on a relative change in capacitance. For example, the controller may determine that an input has been received at a particular keyswitch if the capacitance exceeds or falls below a certain threshold value. Additionally or alternatively, the determination may be made based on a degree of change in capacitance, e.g., if the capacitance changes by 5% or greater.

According to certain implementations, at operation 1106, the controller may then determine a nature of the input based on one or more preset rules, which may be implemented using software, hardware, logic or the like. The preset rule may be based on whether the capacitance exceeds or falls below a preselected threshold. The threshold may be a higher (or lower) threshold than the threshold that determines that an input has been received at the keyswitch. Thus, a half or slight press of a key may have a first functionality while fully depressing the key may have a second functionality. Customizing how the controller interprets the capacitance information may alleviate key teasing issues, such as when a switch is barely closed, then open, then closed etc. Customizing may also be used for gaming applications.

Additionally or alternatively, the preset rule may be based on a relative degree of change in capacitance (e.g. a change vector) and/or a timing of the change. Thus, the keyswitch may be customized to detect a given input based on a degree of change of capacitance (as opposed to an absolute threshold). Similarly, the keyswitch may be customized to detect a given input based on the amount of time that the capacitance is changed, e.g., an extremely brief change in capacitance may be disregarded or may have one functionality, while depressing and holding a key in a depressed state for a given period of time may have a different functionality. This additional customization may further alleviate key teasing issues, such as when a switch is barely closed, then open, then closed etc.

At operation 1108, the controller determines that the keyswitch is no longer activated because the key is no longer depressed. This determination may be based on a change in capacitance of the keyswitch back to its value before the key was depressed.

The settings, preset rules, and so forth may be adjusted by a designer of the keyboard using hardware, software, or firmware techniques and/or may be configurable by an end user using software.

Additional and Alternative Implementation Notes

In the above description of exemplary implementations, for purposes of explanation, specific numbers, materials configurations, and other details are set forth in order to better explain the present invention, as claimed. However, it will be apparent to one skilled in the art that the claimed invention may be practiced using different details than the exemplary ones described herein. In other instances, well-known features are omitted or simplified to clarify the description of the exemplary implementations.

The inventors intend the described exemplary implementations to be primarily examples. The inventors do not intend these exemplary implementations to limit the scope of the appended claims. Rather, the inventors have contemplated that the claimed invention might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

These processes are illustrated as a collection of blocks in a logical flow graph, which represents a sequence of operations that can be implemented in mechanics alone or a combination with hardware, software, and/or firmware. In the context of software/firmware, the blocks represent instructions stored on one or more computer-readable storage media that, when executed by one or more processors, perform the recited operations.

Note that the order in which the processes are described is not intended to be construed as a limitation, and any number of the described process blocks can be combined in any order to implement the processes or an alternate process. Additionally, individual blocks may be deleted from the processes without departing from the spirit and scope of the subject matter described herein.

The term "computer-readable media" includes computer-storage media. For example, computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)).

Unless the context indicates otherwise, the term "logic" used herein includes hardware, software, firmware, circuitry, logic circuitry, integrated circuitry, other electronic components and/or a combination thereof that is suitable to perform the functions described for that logic.

In the claims appended herein, the inventor invokes 35 U.S.C. §112, paragraph 6 only when the words "means for" or "steps for" are used in the claim. If such words are not used in a claim, then the inventor does not intend for the claim to be construed to cover the corresponding structure, material, or acts described herein (and equivalents thereof) in accordance with 35 U.S.C. §112, paragraph 6.

What is claimed is:

1. A keyboard comprising:
    a capacitance-based keyswitch matrix comprising:
        a plurality of keycaps, each keycap of the plurality of keycaps including a surface configured to be pressed by a user of the keyboard;
        a plurality of first electrodes, wherein the plurality of first electrodes is associated with the plurality of keycaps such that each keycap of the plurality of keycaps is associated with an electrode of the plurality of first electrodes;
        a plurality of second electrodes capacitively coupled with the plurality of first electrodes,
        wherein a press force applied by the user to the surface of a first keycap of the plurality of keycaps moves the first keycap and causes a change in a measureable capacitance of the capacitance-based keyswitch matrix by moving the electrode of the plurality of first electrodes associated with the first keycap relative to the electrode of the plurality of second electrodes associated with the first keycap; and
    a controller communicatively coupled to the capacitance-based keyswitch matrix, the controller configured to:
        operate the capacitance-based keyswitch matrix to sense the change in the measurable capacitance; and
        determine the press force applied to first keycap based upon the change in the measurable capacitance.

2. The keyboard of claim 1, wherein the plurality of second electrodes is associated with the plurality of keycaps such that each keycap of the plurality of keycaps is associated with an electrode of the plurality of second electrodes.

3. The keyboard of claim 1, wherein the press force applied by the user is determined based upon an amount of change in the measurable capacitance or a rate of change of the measurable capacitance.

4. The keyboard of claim 1, further comprising:
    a ready/return mechanism associated with the first keycap, the ready/return mechanism comprising the electrode of the plurality of first electrodes associated with the first keycap, wherein the electrode of the plurality of first electrodes comprises a permanent magnet.

5. The keyboard of claim 1, wherein the controller is further configured to determine a gesture performed by the user on the plurality of keycaps using signals indicative of the changes in measurable capacitances due to press forces applied by the user to the plurality of keycaps.

6. The keyboard of claim 1, wherein a second keycap of the plurality of keycaps is associated with multiple electrodes of the plurality of first electrodes and multiple electrodes of the plurality of second electrodes, such that the second keycap is associated with multiple measurable capacitances of the capacitance-based keyswitch matrix, and wherein the controller is further configured to determine a gesture performed by the user on the surface of the second keycap using signals indicative of changes in the multiple measurable capacitances associated with the second keycap.

7. The keyboard of claim 1, further comprising:
    a light-plate configured to provide backlighting for the capacitance-based keyswitch.

8. The keyboard of claim 1, wherein the plurality of first electrodes is configured to float electrically during operation.

9. A method of operating a keyboard comprising:
    operating a capacitance-based keyswitch matrix to sense a plurality of mutual capacitances associated with a plurality of keycaps of the keyboard, each mutual capacitance coupling magnetic material of an electrode of a plurality of first electrodes of the capacitance-based keyswitch matrix with an electrode of a plurality of second electrodes of the capacitance-based keyswitch matrix;
    determining a press force applied to a first keycap of the plurality of keycaps based upon changes in a mutual capacitance associated with the first keycap; and providing output to a computer processor in response to the determining the press force applied to the first keycap, the output indicative of the press force applied to the first keycap.

10. The method of claim 9, further comprising:
determining a gesture performed by a user on the plurality of keycaps using signals from the capacitance-based keyswitch matrix, the signals indicative of changes in mutual capacitances of the plurality of mutual capacitances due to the press forces applied by the user to the plurality of keycaps.

11. The method of claim 9, wherein a second keycap of the plurality of keycaps is associated with multiple mutual capacitances of the plurality of mutual capacitances, the method further comprising:
determining a gesture performed by a user on a surface of the second keycap using signals indicative of changes in the multiple mutual capacitances of the plurality of mutual capacitances associated with the second keycap.

12. A key assembly comprising:
a keycap having a surface configured to be pressed by a user;
a first electrode configured to be moved by the keycap, the first electrode comprising magnetic material; and
a second electrode separated from the magnetic material by a gap, wherein a press by the user to the keycap causes the magnetic material to move relative to the second electrode and change the gap, such that a capacitance coupling the magnetic material and the second electrode changes in response to the press;
whereby, an amount of force applied to the keycap can be determined based on changes in the capacitance coupling.

13. The key assembly of claim 12, wherein the first electrode is configured to float electrically during operation.

14. The key assembly of claim 12, further comprising:
a ready/return mechanism comprising the magnetic material of the first electrode, wherein the magnetic material comprises a permanent magnet.

15. The key assembly of claim 12, further comprising:
a third electrode positioned fixedly relative to the second electrode, the third electrode capacitively coupled to both the magnetic material and the second electrode, wherein the press by the user to the keycap causes the magnetic material to move relative to the third electrode and change a second capacitance.

16. The key assembly of claim 12, further comprising:
a third electrode configured to be moved by the keycap; and
a fourth electrode separated from the third electrode by a second gap, wherein the press by the user to the keycap causes the third electrode to move relative to the fourth electrode and change the second gap, such that a second capacitance coupling the third electrode and the fourth electrode changes in response to the press.

17. The key assembly of claim 16, further comprising:
a controller communicatively coupled to a plurality electrodes, the plurality of electrodes comprising at least two electrodes selected from the group consisting of the first electrode, the second electrode, the third electrode, and the fourth electrode, wherein the controller is configured to determine gestures performed by the user on the surface of the keycap using signals from the plurality of electrodes.

18. The key assembly of claim 12, further comprising:
a capacitance matrix comprising at least one electrode selected from the group consisting of the first electrode and the second electrode; and
a controller configured to operate the capacitance matrix, and to switch the capacitance matrix from mutual capacitance sensing to self-capacitance sensing.

19. The key assembly of claim 12, further comprising:
a dielectric cushion disposed between the first electrode and the second electrode to limit the amount of movement of the magnetic material relative to the second electrode, wherein the capacitance coupling between the magnetic material and the second electrode changes with a press force applied to the keycap; and
a controller configured to determine the amount of force applied based upon changes in the capacitance coupling the magnetic material and the second electrode.

20. The key assembly of claim 12, further comprising:
an elastomeric support physically coupled with the keycap, the elastomeric support configured to deform in response to the press on the keycap and return to its original shape in response to a release of the press.

21. The method of claim 9, further comprising:
sensing user presence near one or more of the plurality of keycaps and waking up a device in response thereto.

22. The method of claim 9, further comprising:
sensing user presence near one or more of the plurality of keycaps and triggering a keyboard lighting system in response thereto.

* * * * *